United States Patent
Kim et al.

(10) Patent No.: US 9,762,229 B2
(45) Date of Patent: Sep. 12, 2017

(54) DATA COMMUNICATING METHOD FOR USE IN A SINGLE-WIRE PROTOCOL COMMUNICATION AND A SINGLE-WIRE PROTOCOL COMMUNICATION SYSTEM USING THE SAME

(71) Applicant: SAMSUNG ELECTRONICS CO., LTD., Suwon-si, Gyeonggi-do (KR)

(72) Inventors: Sunkwon Kim, Yongin-si (KR); Ki Hong Kim, Osan-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 162 days.

(21) Appl. No.: 14/645,536

(22) Filed: Mar. 12, 2015

(65) Prior Publication Data
US 2015/0303992 A1    Oct. 22, 2015

(30) Foreign Application Priority Data

Apr. 16, 2014    (KR) .................... 10-2014-0045572

(51) Int. Cl.
H04B 3/54    (2006.01)
H03K 7/08    (2006.01)

(52) U.S. Cl.
CPC .................... *H03K 7/08* (2013.01)

(58) Field of Classification Search
CPC ... H04B 3/54; H04B 5/00; H04B 5/02; H04B 3/00; H04L 25/0264
USPC ........................... 375/219–222, 257
See application file for complete search history.

(56) References Cited

U.S. PATENT DOCUMENTS

| 5,583,892 | A |   | 12/1996 | Drakul et al. |
|---|---|---|---|---|
| 5,673,130 | A | * | 9/1997 | Sundstrom ............ H04L 7/0008 375/293 |
| 5,847,666 | A |   | 12/1998 | Yasoshima et al. |
| 7,352,301 | B2 | * | 4/2008 | Pappalardo .......... H04B 10/503 341/50 |
| RE40,864 | E | * | 7/2009 | Hong .................. H04L 25/4915 345/100 |
| 7,869,525 | B2 | * | 1/2011 | Macri ....................... H03L 7/07 341/55 |

(Continued)

FOREIGN PATENT DOCUMENTS

| JP | 2008-311829 | 12/2008 |
|---|---|---|
| JP | 2010-239437 | 10/2010 |

(Continued)

*Primary Examiner* — Emmanuel Bayard
(74) *Attorney, Agent, or Firm* — F. Chau & Associates, LLC

(57) ABSTRACT

A data communication method in a single-wire protocol communication is provided. The method includes determining a number of first data bits having a logical high state or a number of second data bits having a logical low state from among data bits in a communication packet, determining whether the number of the first data bits exceeds a first predetermined number or the number of the second data bits is below a second predetermined number, inverting the data bits in the communication packet when the number of the first data bits exceeds the first predetermined number or the number of the second data bits is below the second determined number, and transferring the inverted data bits to a reception side via a single-wire input/output.

18 Claims, 16 Drawing Sheets

(56) References Cited

U.S. PATENT DOCUMENTS

| | | | |
|---|---|---|---|
| 7,932,762 B2* | 4/2011 | Turner | H03K 3/0375 |
| | | | 326/93 |
| 7,986,251 B2* | 7/2011 | Bae | G11C 7/1006 |
| | | | 341/55 |
| 7,990,796 B2* | 8/2011 | Brown | G06F 1/3225 |
| | | | 365/121 |
| 8,207,877 B2 | 6/2012 | Ha et al. | |
| 8,239,636 B2 | 8/2012 | Moschopoulos | |
| 8,447,906 B2 | 5/2013 | Marseille et al. | |
| 2002/0155808 A1 | 10/2002 | Kawamura | |
| 2008/0187084 A1* | 8/2008 | Lim | H03K 5/135 |
| | | | 375/371 |
| 2010/0245048 A1 | 9/2010 | Kim | |
| 2011/0200059 A1 | 8/2011 | Tavallaei | |
| 2011/0206160 A1 | 8/2011 | Sung et al. | |
| 2013/0040566 A1 | 2/2013 | Mourtel et al. | |
| 2013/0044543 A1* | 2/2013 | Kim | G11C 5/025 |
| | | | 365/185.12 |
| 2016/0019179 A1* | 1/2016 | Loke | G06F 13/4208 |
| | | | 341/58 |
| 2016/0162434 A1* | 6/2016 | Mozak | G06F 13/4221 |
| | | | 710/106 |

FOREIGN PATENT DOCUMENTS

| | | |
|---|---|---|
| KR | 1020070011743 | 1/2007 |
| KR | 1020110096808 | 8/2011 |

\* cited by examiner

DATA COMMUNICATING METHOD FOR USE IN A SINGLE-WIRE PROTOCOL COMMUNICATION AND A SINGLE-WIRE PROTOCOL COMMUNICATION SYSTEM USING THE SAME

CROSS-REFERENCE TO RELATED APPLICATIONS

This patent application claims priority under 35 U.S.C. §119 to Korean Patent Application No. 10-2014-0045572, filed on Apr. 16, 2014, in the Korean Intellectual Property Office, the disclosure of which is incorporated by reference herein in its entirety.

TECHNICAL FIELD

The present inventive concept relates to a data communication, and more particularly, to a data communication method used in a single-wire protocol communication and a single-wire protocol communication using the same.

DISCUSSION OF THE RELATED ART

Various applications (e.g., an electronic payment) using a Near Field Communication (NFC) chip of a portable electronic device have been developed.

To authenticate a subscriber's identification when the electronic payment is requested, the NFC chip may communicate with a Subscriber Identification Module (SIM) card chip that is embedded in the portable electronic device using a single-wire protocol (SWP).

SUMMARY

According to an exemplary embodiment of the present inventive concept, a data communication method in a single-wire protocol communication is provided. The method includes determining a number of first data bits having a logical high state or a number of second data bits having a logical low state from among data bits in a communication packet, determining whether the number of the first data bits is greater than a first predetermined number or the number of the second data bits is smaller than a second predetermined number, inverting the data bits in the communication packet when the number of the first data bits is greater than the first determined number or the number of the second data bits is smaller than the second determined number, and transferring the inverted data bits to a reception side via a single-wire input/output.

In an exemplary embodiment of the present inventive concept, the method may further include setting a polarity bit indicating that the data bits of the communication packet are inverted.

In an exemplary embodiment of the present inventive concept, the data bits in the communication packet may be transferred via the single-wire input/output without inversion of the data bits when the number of the first data bits is smaller than the first predetermined number or the number of the second data bits is greater than the second predetermined number.

In an exemplary embodiment of the present inventive concept, the data bits of the communication packet may be transferred using at least one of a pulse width modulation technique or a current sink modulation technique.

In an exemplary embodiment of the present inventive concept, the data bits of the communication packet may be transferred in a first direction of the single-wire input/output in a current sink modulation technique. The data bits of the communication packet may be transferred in a second direction of the single-wire input/output in a pulse width modulation technique. The second direction may be opposite to the first direction.

In an exemplary embodiment of the present inventive concept, the single-wire input/output may be connected between a near field communication (NFC) chip and a subscriber identification module (SIM) card chip.

In an exemplary embodiment of the present inventive concept, the single-wire input/output may be connected between a near field communication (NFC) chip and an embedded secure element (eSE) chip.

In an exemplary embodiment of the present inventive concept, the polarity bit may be set to be a logical high state.

In an exemplary embodiment of the present inventive concept, the inverted data bits may be inverted at the reception side.

In an exemplary embodiment of the present inventive concept, the data communication method may be used in a portable electronic device including a near field communication (NFC) chip.

According to an exemplary embodiment of the present inventive concept, a single-wire protocol communication system is provided. The system includes a first circuit, a second circuit, and a single-wire input/output connected between the first circuit and the second circuit. At least one of the first and second circuits is configured to invert logical states of data bits in a communication packet when a number of first data bits having a first logical state from among the data bits of the communication packet exceeds a predetermined number, to set a polarity bit indicating that the data bits are inverted, and to transmit the set polarity bit and the inverted data bits via the single-wire input/output.

In an exemplary embodiment of the present inventive concept, the predetermined number may be half a number of the data bits in the communication packet.

In an exemplary embodiment of the present inventive concept, the data bits in the communication packet may be transferred via the single-wire input/output without inversion of the logical states of the data bits when the number of the first data bits is less than the predetermined number.

In an exemplary embodiment of the present inventive concept, the data bits of the communication packet may be transferred in a first direction of the single-wire input/output using a pulse width modulation technique. The data bits of the communication packet may be transferred in a second direction of the single-wire input/output in a current sink modulation technique.

In an exemplary embodiment of the present inventive concept, the single-wire input/output may be connected between a near field communication (NFC) chip and a subscriber identification module (SIM) card chip or between the NFC chip and an embedded secure element (eSE) chip.

According to an exemplary embodiment of the present inventive concept, a single-wire protocol communication system is provided. The system includes a first circuit, a second circuit, and a single-wire input/output. The first circuit is configured to transmit a first communication packet to a second circuit and to receive a second communication packet from the second circuit. The second circuit is configured to transmit the second communication packet to the first circuit and to receive the first communication packet from the first circuit. The first and second circuits transmit and receive the first and second communication packets through the single-wire input/output connected between the first circuit and the second circuit. The data bits of the first communication packet are inverted when a number of first data bits having a logical high state among the data bits of the first communication packet exceeds a predetermined number. The data bits of the first communication packet are not inverted when the number of the first data bits having the logical high state among the data bits of the first communication packet is less than the predetermined number.

In an exemplary embodiment of the present inventive concept, the first circuit may be a master circuit, and the second circuit may be a slave circuit.

In an exemplary embodiment of the present inventive concept, the data bits of the first communication packet may be transferred using at least one of a pulse width modulation technique or a current sink modulation technique.

In an exemplary embodiment of the present inventive concept, data bits of the second communication packet may be inverted when a number of second data bits having the logical high state among the data bits of the second communication packet exceeds a predetermined number. The data bits of the second communication packet may not be inverted when the number of the second data bits having the logical high state among the data bits of the second communication packet is less than the predetermined number. The data bits of the first communication packet may be transferred using a pulse width modulation technique, and the data bits of the second communication packet may be transferred using a current sink modulation technique.

In an exemplary embodiment of the present inventive concept, data bits of the second communication packet may be inverted when a number of second data bits having the logical high state among the data bits of the second communication packet exceeds a predetermined number. The data bits of the second communication packet may not be inverted when the number of the second data bits having the logical high state among the data bits of the second communication packet is less than the predetermined number. The data bits of the first communication packet may be transferred using a current sink modulation technique, and the data bits of the second communication packet may be transferred using a pulse width modulation technique.

BRIEF DESCRIPTION OF THE FIGURES

The above and other aspects of the present inventive concept will become more apparent by describing in detail exemplary embodiments thereof with reference to the accompanying drawings in which.

DETAILED DESCRIPTION OF THE EMBODIMENTS

Figure 1:
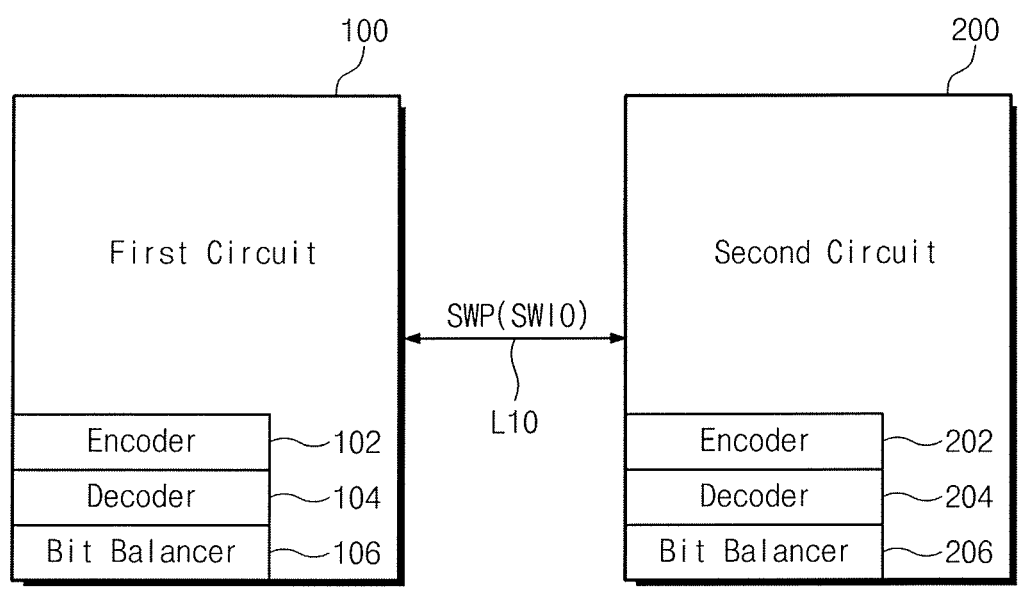
FIG. 1 is a block diagram of a single-wire protocol communication system according to an exemplary embodiment of the present inventive concept.

Hereinafter, exemplary embodiments of the present inventive concept will be described in detail with reference to the accompanying drawings. The inventive concept, however, may be embodied in various different forms, and should not be construed as being limited only to the illustrated embodiments. Like reference numerals may denote like elements throughout the attached drawings and written description. In the drawings, the sizes and relative sizes of layers and regions may be exaggerated for clarity.

As used herein, the singular forms "a", "an" and "the" are intended to include the plural forms as well, unless the context clearly indicates otherwise.

It will be understood that when an element or layer is referred to as being "on", "connected to", "coupled to", or "adjacent to" another element or layer, it can be directly on, connected, coupled, or adjacent to the other element or layer, or intervening elements or layers may be present.

FIG. 1 is a block diagram of a single-wire protocol communication system according to an exemplary embodiment of the present inventive concept.

Referring to FIG. 1, a single-wire protocol (SWP) communication system includes a first circuit 100 and a second circuit 200. A single-wire input/output (SWIO) L10 is connected between the first and second circuits 100 and 200 for the SWP communication. For example, the single-wire input/output (SWIO) L10 may be a single line.

The first circuit 100 includes an encoder 102, a decoder 104, and a bit balancer 106.

The second circuit 200 includes an encoder 202, a decoder 204, and a bit balancer 206.

Each of the encoders 102 and 202 encodes data to be transmitted to a reception side and outputs an encoded result to the single-wire input/output L10.

Each of the decoders 104 and 204 decodes data received via the single-wire input/output L10.

Each of the bit balancers 106 and 206 selectively performs an operation of inverting logical states of data bits in a communication packet, based on the number of data bits having a first logical state (e.g., data 1 or logical high state) from among data bits encoded to the communication packet. For example, at least one of the bit balancers 106 and 206 may invert logical states of data bits in a communication packet when the number of data bits having the first logical state from among the data bits in the communication packet exceeds a predetermined number (e.g., half the number of data bits in the communication packet). In this case, a polarity bit indicating that a logical state is inverted may be set in the communication packet. The set polarity bit may be transmitted via the single-wire input/output L10 together with the inverted data bits. However, the present inventive concept is not limited thereto. For example, the polarity bit may not be included in the communication packet.

Figure 2:
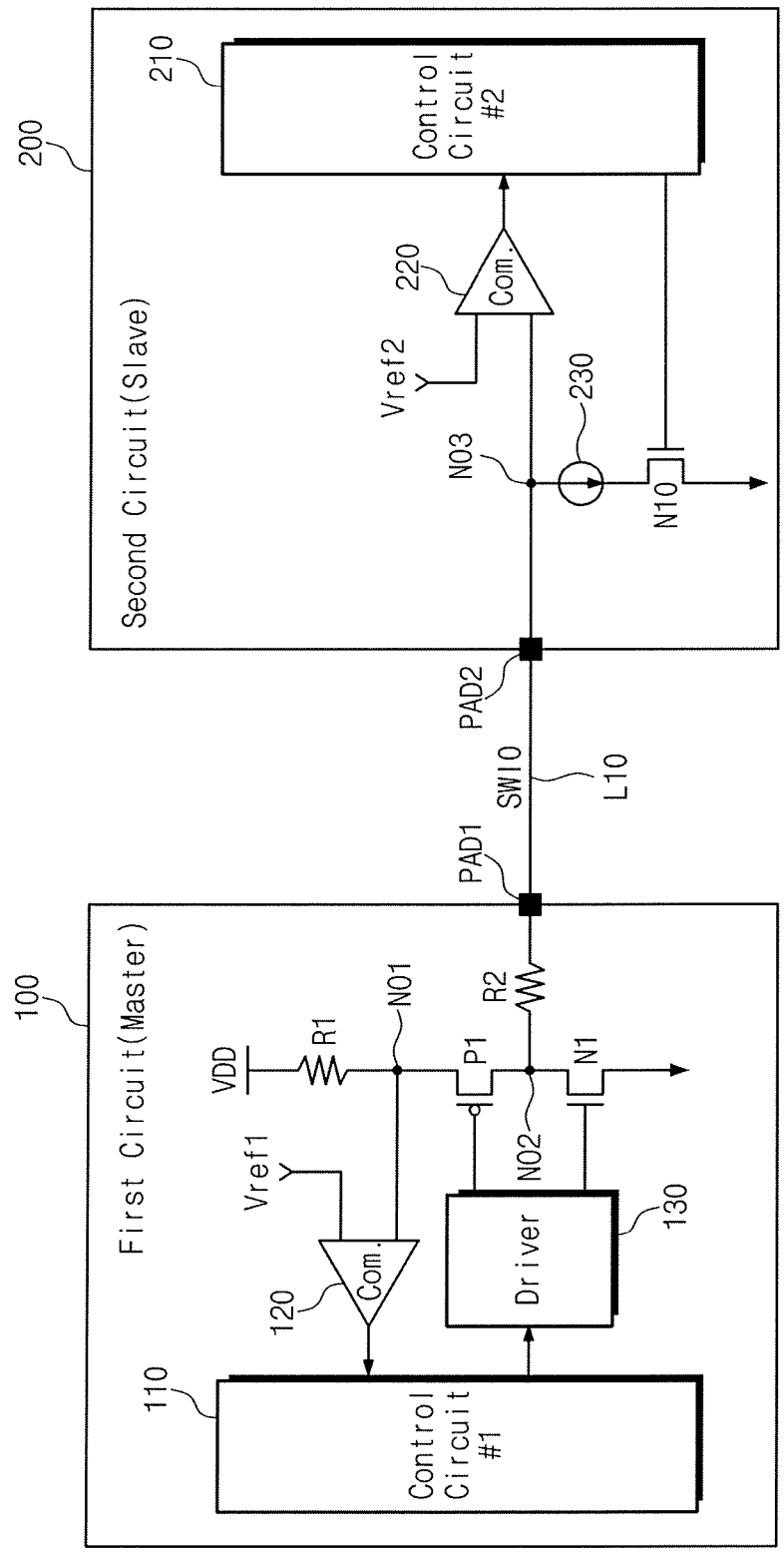
FIG. 2 is a circuit diagram of the single-wire protocol communication system shown in FIG. 1 according to an exemplary embodiment of the present inventive concept.

FIG. 2 is a circuit diagram of the single-wire protocol communication system shown in FIG. 1 according to an exemplary embodiment of the present inventive concept.

Referring to FIG. 2, the first circuit 100 includes a first control circuit 110, a first comparator 120, a driver 130, resistors R1 and R2, and MOS transistors P1 and N1. The first control circuit 110 may include the encoder 102, the decoder 104, and the bit balancer 106 as shown in FIG. 1. An output of the first comparator 120 is applied to the decoder 104, and an output of the encoder 102 is applied to the driver 130.

The second circuit 200 comprises a second control circuit 210, a second comparator 220, a current source 230, and a MOS transistor N10. The second control circuit 210 may include the encoder 202, the decoder 204, and the bit balancer 206 as shown in FIG. 1. An output of the second comparator 220 is applied to the decoder 204, and an output of the encoder 202 is applied to the MOS transistor N10.

For ease of description, the first circuit 100 may be a master, and the second circuit 200 may be a slave.

A data transfer direction from the master to the slave is a first direction, and a data transfer direction from the slave to the master is a second direction.

In case of an SWP communication, a bidirectional communication is performed via a single-wire input/output L10. For example, a data transfer technique corresponding to the first direction is different from a data transfer technique corresponding to the second direction. Data transfer techniques will be more fully described with reference to FIGS. 3 and 4.

Figure 3:
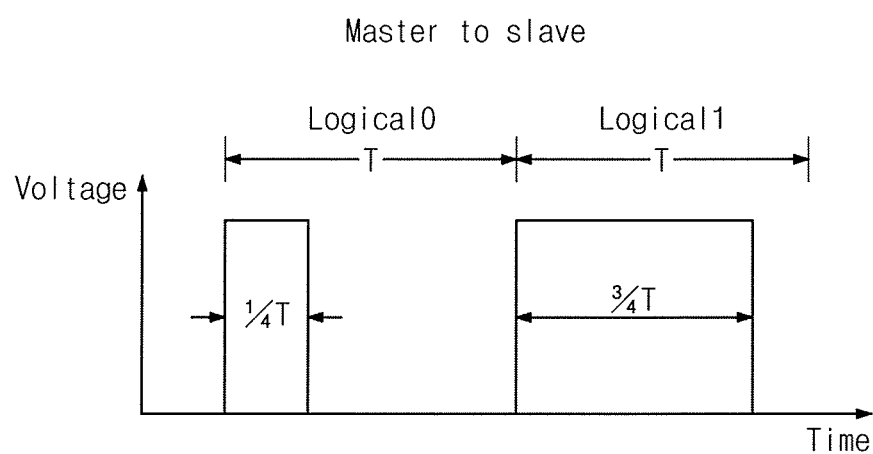
FIG. 3 is a diagram illustrating a voltage waveform when data is transferred in a first direction described with reference to FIG. 2 according to an exemplary embodiment of the present inventive concept.
Figure 4:
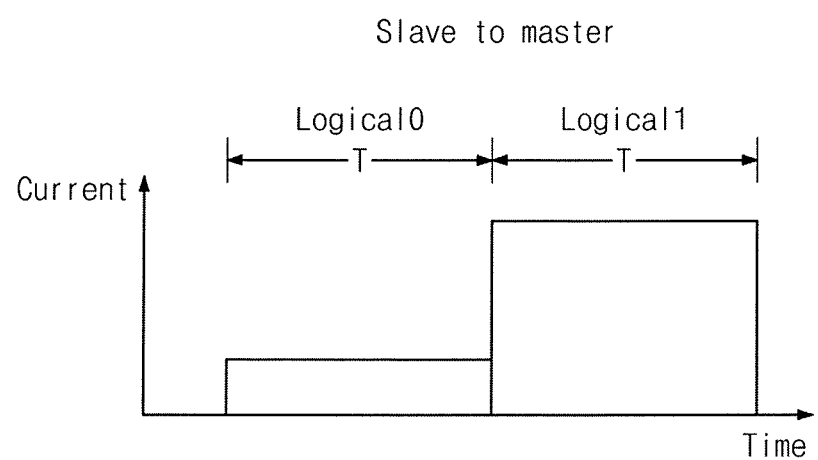
FIG. 4 is a diagram illustrating a current waveform when data is transferred in a second direction described with reference to FIG. 2 according to an exemplary embodiment of the present inventive concept.

FIG. 3 is a diagram illustrating a voltage waveform when data is transferred in a first direction described with reference to FIG. 2 according to an exemplary embodiment of the present inventive concept. FIG. 4 is a diagram illustrating a current waveform when data is transferred in a second direction described with reference to FIG. 2 according to an exemplary embodiment of the present inventive concept.

In FIG. 3, a horizontal axis represents a time, and a vertical axis represents a voltage level. When data 0 (e.g., data having a logical low state) is transmitted in a period T, a high-level voltage may be output via a single-wire input/output L10 during T/4. To this end, the first control circuit 110 shown in FIG. 2 controls the driver 130 such that the PMOS transistor P1 is first turned on during T/4 and the NMOS transistor N1 is next turned on during 3T/4. In addition, when data 1 (e.g., data having a logical high state) is transmitted in a period T, a high-level voltage may be output via the single-wire input/output L10 during 3T/4. To this end, the first control circuit 110 controls the driver 130 such that the PMOS transistor P1 is turned on during 3T/4 and the NMOS transistor N1 is turned on during T/4. Thus, as shown in FIG. 3, data may be transmitted by adjusting a width of a data pulse. This data transfer technique is a PWM (pulse width modulation) technique, and hereinafter is referred to as an "S1" transfer.

In FIG. 4, a horizontal axis represents a time, and a vertical axis represents a current level. When data 0 (e.g., a logical low state) is transmitted in a period T, a high-level current may be output via the single-wire input/output L10 during a portion of the period T. To this end, the second control circuit 210 turns off the NMOS transistor N10. Since the NMOS transistor N10 is turned off, the amount of current flowing from a node N03 to a ground may decrease. In this case, the amount of current at the node N03 may be maintained below several tens of microamperes (e.g., about 20 microamperes). In addition, when data 1 (e.g., a logical high state) is transmitted in a period T, a high-level current may be output via the single-wire input/output L10 during a portion of the period T. To this end, the second control circuit 210 turns on the NMOS transistor N10. Since the NMOS transistor N10 is turned on, the amount of current flowing from the node N03 to the ground may increase. In this case, the amount of current at the node N03 may increase as much as several hundreds of microamperes (e.g., about 600 to 1000 microamperes). Thus, as shown in FIG. 4, data may be transmitted by changing a current sink. This data transfer technique is a CSM (current sink modulation) technique, and hereinafter, is referred to as an "S2" transfer.

In FIGS. 3 and 4, the S1 transfer is made using the PWM technique, and the S2 transfer is made using the CSM technique. However, the present inventive concept is not limited thereto. For example, the S1 transfer may be made using the CSM technique, and the S2 transfer may be made using the PWM technique. In an exemplary embodiment of the present inventive concept, data transmission may be made using a modulation different from the CSM or PWM.

Hereinafter, a bidirectional communication based on the data transfer technique (e.g., the PWM or CSM) of FIG. 3 or 4 via a single-wire input/output L10 will be described in more detail with reference to FIG. 5.

Figure 5:
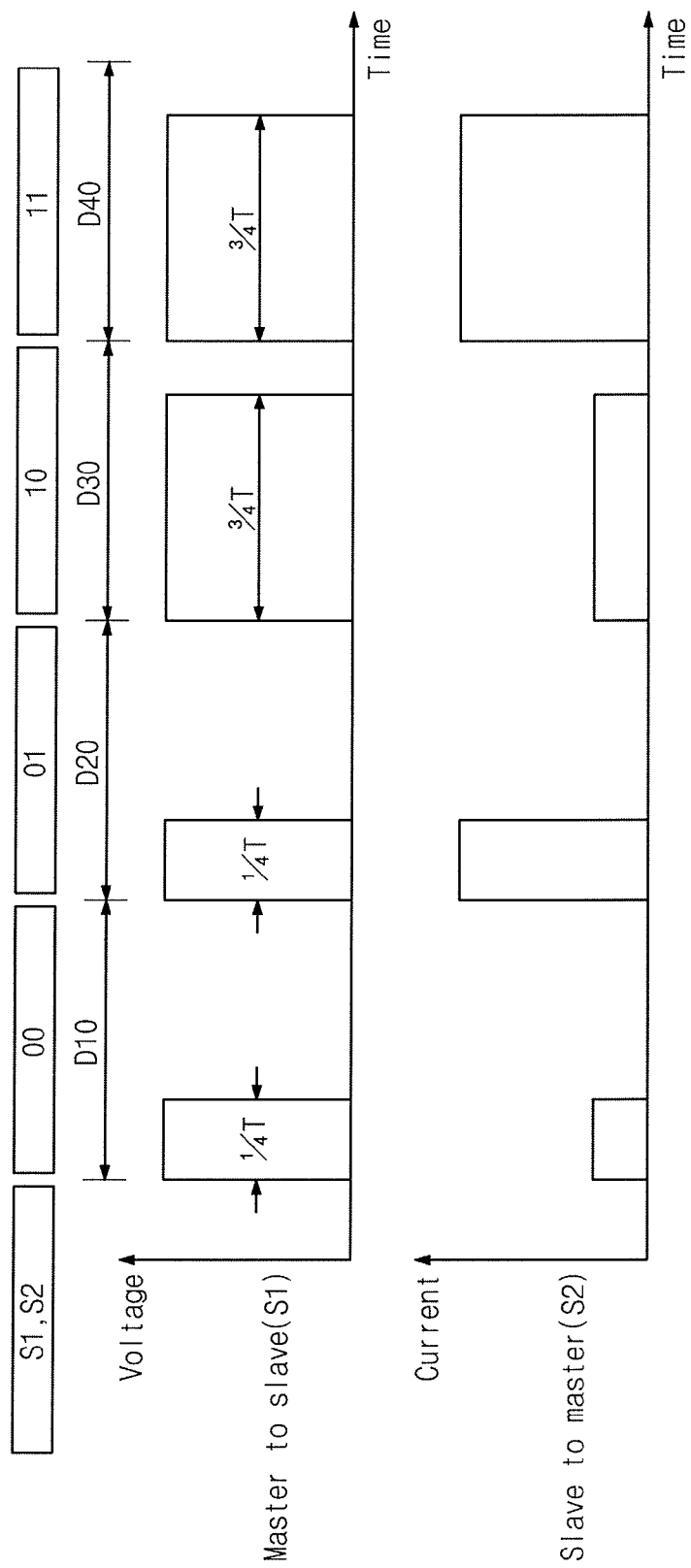
FIG. 5 is a waveform diagram of a modulation signal for a single-wire protocol communication described with reference to FIG. 2 according to an exemplary embodiment of the present inventive concept.

FIG. 5 is a waveform diagram of a modulation signal for an SWP communication described with reference to FIG. 2 according to an exemplary embodiment of the present inventive concept.

In a period D10, an S1 transfer where data 0 is transmitted in a first direction is accomplished by setting a first pad PAD1 in FIG. 2 with a high-level voltage during T/4, and an S2 transfer where data 0 is transmitted in a second direction is accomplished by setting a second pad PAD2 in FIG. 2 with a low-level current during T/4.

In a period D20, the S1 transfer where data 0 is transmitted in the first direction is accomplished by driving the first pad PAD1 with the high-level voltage during T/4, and the S2 transfer where data 1 is transmitted in the second direction is accomplished by driving the second pad PAD2 with a high-level current during T/4.

In a period D30, the S1 transfer where data 1 is transmitted in the first direction is accomplished by forcing the first pad PAD1 with the high-level voltage during 3T/4, and the S2 transfer where data 0 is transmitted in the second direction is accomplished by forcing the second pad PAD2 with the low-level current during 3T/4.

In a period D40, the S1 transfer where data 1 is transmitted in the first direction is accomplished by providing the first pad PAD1 with the high-level voltage during 3T/4, and the S2 transfer where data 1 is transmitted in the second direction is accomplished by providing the second pad PAD2 with the high-level current during 3T/4.

In FIG. 5, each current pulse duration during the S2 transfer is the same as each voltage pulse duration during the S1 transfer. However, the present inventive concept is not limited thereto. For example, each current pulse duration during the S2 transfer may be variable.

A duty ratio of a voltage may be changed during the S1 transfer in which data is transmitted from a master to a slave, and the amount of sink current may be changed during the S2 transfer in which data is transmitted from the slave to the master.

In case of the S1 transfer, logical 0 (e.g., data 0) may be expressed by setting a duration time of the high-level voltage to 25% (e.g., T/4) of one period T, and logical 1 (e.g., data 1) may be expressed by setting a duration time of the high-level voltage to 75% (e.g., 3T/4) of one period T.

In addition, in case of the S2 transfer, logical 0 may be expressed by sinking a current (e.g., a current at the PAD2) to a level of about 0 to 20 microamperes during a high period of a single-wire input/output L10. Logical 1 may be expressed by sinking a current to a level of about 600 to 1000 microamperes during the high period of the single-wire input/output L10.

In the SWP communication described with reference to FIG. 5, A communication packet is comprised of eight data bits, and power consumption when the eight data bits are in the logical high state may be greater than that when the eight data bits are in the logical low state.

According to an exemplary embodiment of the present inventive concept, selective data inversion may be made to minimize or reduce power consumption during the bidirectional SWP communication via the single-wire input/output. Thus, data may be transmitted after the selective data inversion is performed on the data. This feature will be more fully described with reference to FIG. 6.

Figure 6:
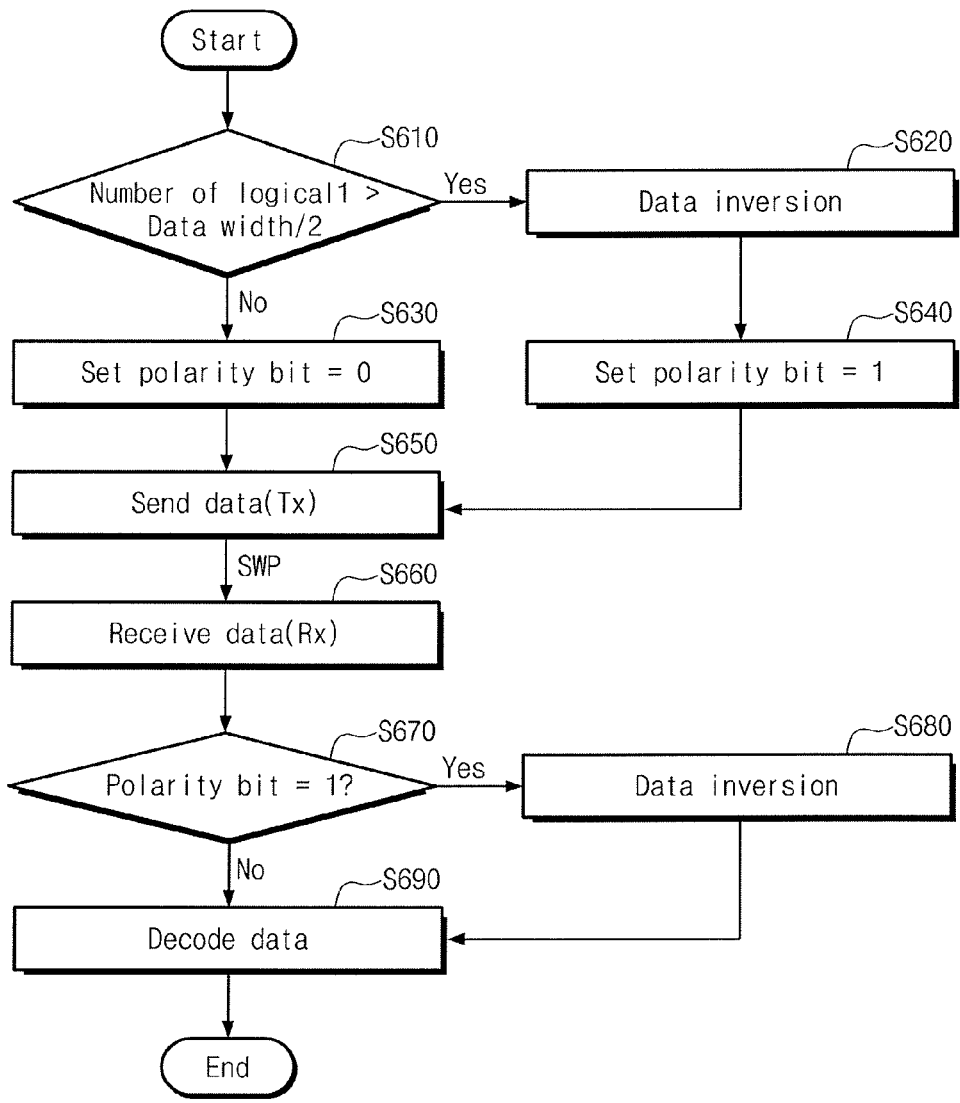
FIG. 6 shows a flow chart of a data communication procedure in a single-wire protocol communication according to an exemplary embodiment of the present inventive concept.

FIG. 6 shows a flow chart of a data communication procedure in an SWP communication according to an exemplary embodiment of the present inventive concept.

In step S610, it is checked whether the number of data bits having a first logical state (e.g., a logical high state or data 1) from among data bits in a communication packet exceeds a predetermined number (e.g., half the number of data bits in the communication packet). However, the present inventive concept is not limited thereto. For example, it may be checked whether the number of data bits having a logical low state (e.g., data 0) from among data bits in a communication packet is below a predetermined number. Here, data in the communication packet may be encoded data. Data in the communication packet may be data that is to be sent using the S1 transfer or the S2 transfer. In case of both S1 and S2 transfers, power consumption may increase as the number of data bits having a logical high state increases.

When the number of data bits corresponding to data 1 from among the data bits in the communication packet exceeds the predetermined number (e.g., half the data width), the method performs step S620 to reduce power consumption. In step S620, logical states of the data bits in the communication packet are inverted. In an exemplary embodiment of the present inventive concept, when the number of data bits corresponding to data 0 from among the data bits in the communication packet is below the predetermined number (e.g., half the data width), the logical states of the data bits in the communication packet may be inverted. For example, when a communication packet is formed of data "00111110", the number of data bits corresponding to data 1 is 5 which exceeds the predetermined number (e.g., half the data width). Thus, in step S620, "00111110" is inverted to yield "11000001". Thus, the number of data bits corresponding to data 1 may decrease from 5 to 3 after the data inversion. The data inversion in step S620 may be independently performed by the bit balancer 106 of the first circuit 100 shown in FIG. 1 or by the bit balancer 206 of the second circuit 200 shown in FIG. 1.

In step S640, a polarity bit indicating that a data bit is inverted may be set to, for example, logical 1. The polarity bit may be used as a flag informing a reception side that inverted data is transmitted. It is described that a polarity bit is set to logical 1 when data inversion is made in an exemplary embodiment of the present inventive concept. However, the present inventive concept is not limited thereto. For example, the polarity bit may be set to logical 0 when the data inversion is made.

Returning to step S610, when the number of data bits corresponding to a first logical state (e.g., data 1 or a logical high state) from among the data bits in the communication packet is below the predetermined number (e.g., half the data width), the method performs step S630, in which the polarity bit may be set to logical 0. In an exemplary embodiment of the present inventive concept, when the number of data bits corresponding to a logical low state from among the data bits in the communication packet exceeds a predetermined number (e.g., half the data width), the polarity bit may be set to logical 0.

In this case, since data inversion is unnecessary, the polarity bit is set to indicate that no data inversion is made.

In step S650, a communication packet is transmitted via the single-wire input/output L10, based on the S1 transfer or the S2 transfer. The communication packet transmitted in step S650 may be data that is inverted or not inverted.

In step S650, data may be transmitted using the S1 transfer-based or S2 transfer-based SWP communication.

In step S660, the communication packet is received. When data transmitted using the S1 transfer is received, the second comparator 220 shown in FIG. 2 compares a voltage at the node N03 with a second reference voltage Vref2. The second control circuit 210 may receive a comparison result from the comparator 220 as reception data.

When data transmitted using the S2 transfer is received, the first comparator 120 shown in FIG. 2 compares a voltage at the node N01 with a first reference voltage Vref1. The first control circuit 110 may receive a comparison result from the comparator 120 as reception data. Here, the voltage level at the node N01 may depend on how to drive the NMOS transistor N10 in the second circuit 200. For example, when the NMOS transistor N10 is turned on, a current path may be formed between the node N03 and the ground, and when the NMOS transistor N10 is turned off, the current path between the node N03 and the ground may be blocked. When the PMOS transistor P1 has been turned on, a voltage level at the node N01 may vary with a change in a current level at the node N02. Thus, it may be understood that the first comparator 120 may act as a comparator for performing comparison based on a current level at the node N03.

In step S670, whether a logical state of a polarity bit is 1 (e.g., a logical high state) is determined. When the logical state of the polarity bit is 1, the method performs step S680. When the logical state of the polarity bit is not 1 (e.g., 0), the method performs step S690. When the logical state of the polarity bit is 1 in step S680, logical states of data bits are inverted to restore original data. For example, when data "11000001" is received and a polarity bit has logical 1, the data "11000001" is inverted to yield "00111110". In addition, when the data "11000001" is received and a received polarity bit has logical 0, data inversion may not be performed.

In step S690, the data of which logical states are inverted or not inverted may be decoded.

When data bits having inverted logical states are received via the single-wire input/output L10, the data bits having the inverted logical states may again be inverted at a reception side. Here, the data inversion may be understood that a logical state of a data bit is changed from 1 to 0 or from 0 to 1.

As described above, when the number of "1" among data bits in a communication packet is more than the number of "0" data bits thereof, data inversion may be made to reduce power consumption. In this case, the polarity bit may be set to indicate that the data inversion has been made. According to an exemplary embodiment of the present inventive concept described with reference to FIG. 6, power consumption in the SWP communication may be reduced without using additional hardware.

Figure 7:
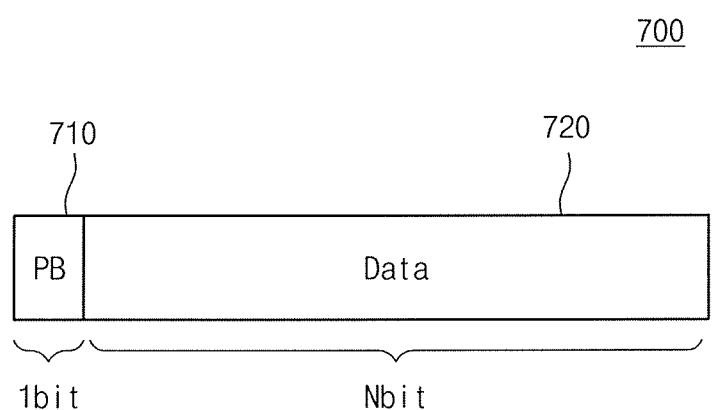
FIG. 7 is a diagram illustrating a configuration of a communication packet according to an exemplary embodiment of the present inventive concept.

FIG. 7 is a diagram illustrating a configuration of a communication packet according to an exemplary embodiment of the present inventive concept.

Referring to FIG. 7, a communication packet 700 may include a polarity bit area 710 and a data area 720. The data area 720 of the communication packet 700 may include N bits (N being a natural number of 1 or more). The polarity bit area 710 of the communication packet 700 may include one or more bits. In FIG. 7, the polarity bit area 710 is defined in a most significant bit (MSB) in accordance with an exemplary embodiment of the present inventive concept. However, the present inventive concept is not limited thereto. For example, the polarity bit area 710 may be defined in a least significant bit (LSB) or an intermediate bit. For example, the communication packet 700 may include data "0000011(1)" under assumption that the least significant bit is used as the polarity bit and the communication packet includes 7-bit data. The least significant bit (1) of the data "0000011(1)" may be a polarity bit indicating that data inversion is made.

Reduction in power consumption when data inversion according to an exemplary embodiment of the present inventive concept is used during the SWP communication will be described in more detail with reference to FIGS. 8 to 11. However, the present inventive concept is not limited to the descriptions thereof.

Figure 8:
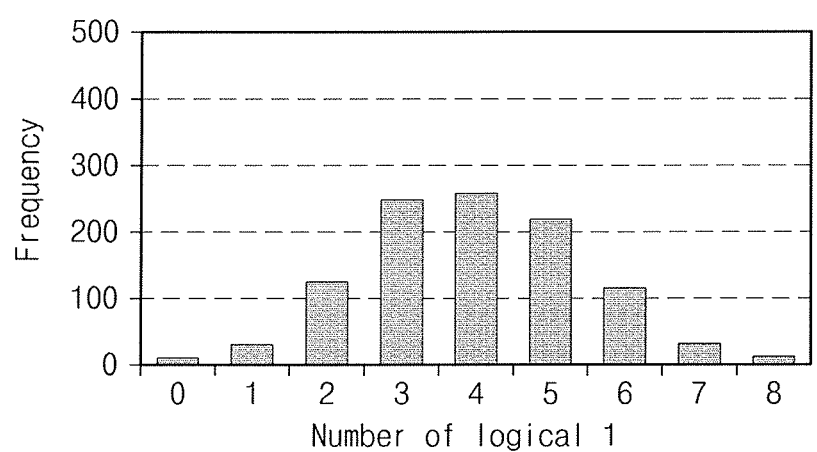
FIG. 8 is a histogram associated with the number of data bits having a logical 1 among 8-bit data.
Figure 9:
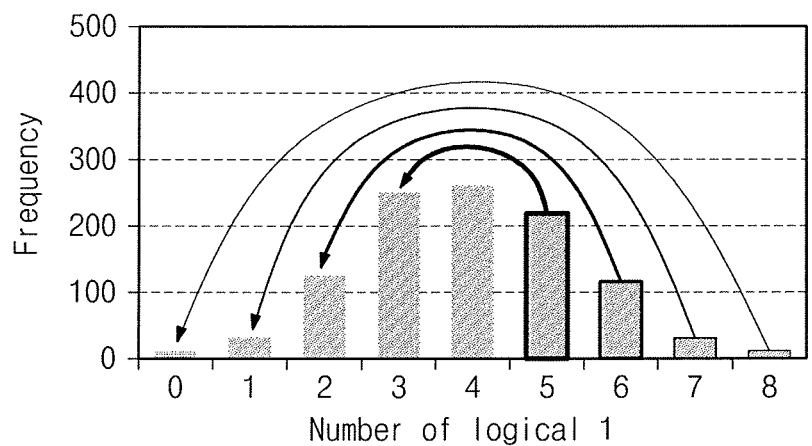
FIG. 9 is a histogram illustrating a data inversion according to an exemplary embodiment of the present inventive concept.
Figure 10:
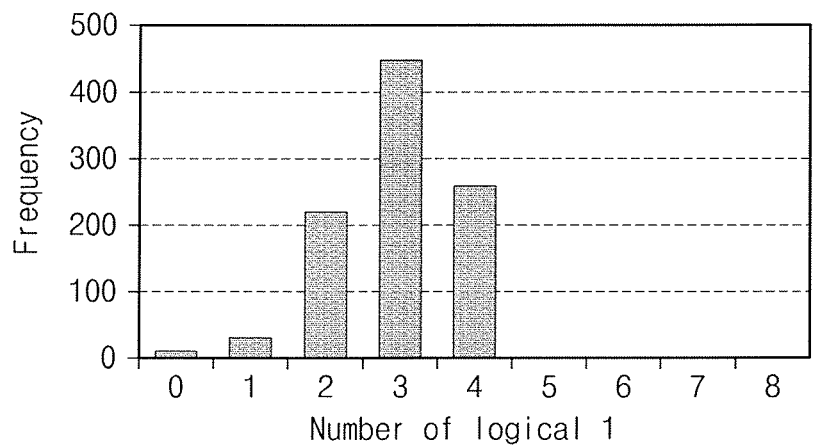
FIG. 10 is a histogram illustrating a result obtained when the data inversion shown in FIG. 8 is performed.
Figure 11:
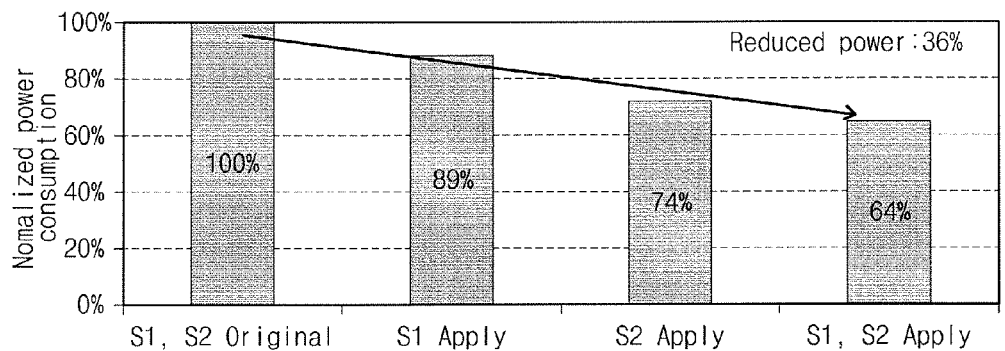
FIG. 11 illustrates power consumption when data transfer techniques according to an exemplary embodiment of the present inventive concept are employed.

FIG. 8 is a histogram associated with the number of data bits having logical 1 (e.g., a logical high state) among 8-bit data. FIG. 9 is a histogram illustrating a data inversion according to an exemplary embodiment of the present inventive concept. FIG. 10 is a histogram illustrating a result obtained when the data inversion shown in FIG. 9 is performed. FIG. 11 illustrates power consumption when data transfer techniques according to an exemplary embodiment of the present inventive concept are employed.

In FIG. 8, a horizontal axis represents the number of data bits having logical 1 (e.g., a logical high state), and a vertical axis represents a frequency in which each number of the data bits having logical 1 occurs. A logical state of each data bit may be random. Referring to FIG. 8, a highest frequency value is found in the center (e.g., 4) of the horizontal axis. According to the SWP communication standard, a sink current corresponding to logical 1 is greater than that corresponding to logical 0. Thus, the number of data bits having logical 1 may be expressed in the form of 8's complement when a polarity bit is set and data is inverted.

For example, referring to FIG. 9, in data "0011_1110", the number of data bits having logical 1 is 5. When a polarity bit is set and data is inverted, the data "0011_1110" is inverted to yield data "1100_0001". In this case, the number of data bits having logical 1 is 3. In FIG. 9, the numbers of data bits having logical 1 which are greater than 4 (e.g., half the total number of data bits) may be transferred to a corresponding 8's complement along arrows.

Referring to FIG. 10, the numbers of data bits having logical 1 are reduced compared to FIG. 8. For example, when the number of data bits having logical 1 among 8-bit data exceeds 4, the data may be inverted, and the numbers of data bits having logical 1 exceeding 4 may be reduced by taking data in the form of 8's complement. In this case, as the number of data bits increases, power consumption may further decrease although a polarity bit is added.

As described above, the power consumption in the SWP communication may be reduced by reducing the number of data bits having logical 1 to be transmitted using data conversion. The present inventive concept may not need an additional hardware since it is implemented by software.

Referring to FIG. 11, power consumption when the data inversion according to an exemplary embodiment of the present inventive concept is employed for the S1 and S2 transfers may be reduced by about 36% compared to that when the data inversion is not employed. In addition, power consumption when the data inversion according to an exemplary embodiment of the present inventive concept is employed for the S1 transfer may be reduced by about 11% compared to that when the data inversion is not employed. Power consumption when the data inversion according to an exemplary embodiment of the present inventive concept is employed for the S2 transfer may be reduced by about 26% compared to that when the data inversion is not employed.

For example, to obtain the results shown in FIG. 11, it is assumed that duty ratios are set to 25% and 75% corresponding to logical 0 and 1, respectively during the S1 data transfer, sink currents are 0 mA and 1 mA corresponding to logical 0 and 1, respectively during the S2 data transfer, a communication packet includes 8-bit data, and a logical state of each bit of the 8 bit data is random. However, the present inventive concept is not limited thereto. The assumed conditions may be modified or changed in various forms. For example, a duty ratio, a sink current, a data width (e.g., the number of data bits in a communication packet), and a polarity bit may be changed.

Figure 12:
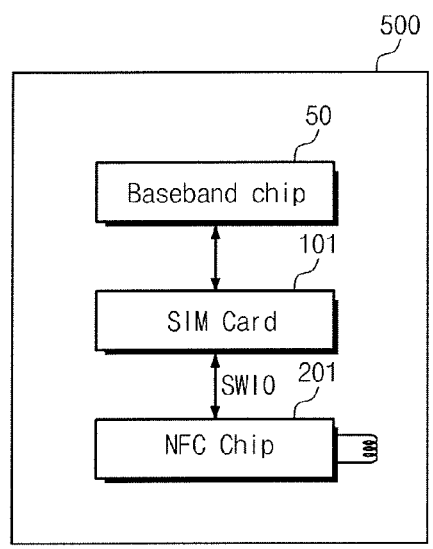
FIG. 12 is a block diagram of a portable electronic device according to an exemplary embodiment of the present inventive concept.

FIG. 12 is a block diagram of a portable electronic device according to an exemplary embodiment of the present inventive concept.

Referring to FIG. 12, a portable electronic device 500 includes a baseband chip 50, a SIM card 101, and an NFC chip 201.

The SIM card 101 stores a subscriber identification code. The subscriber identification code may be authenticated prior to a Radio Frequency (RF) communication using the baseband chip 50. In an exemplary embodiment of the present inventive concept, the subscriber identification code stored in the SIM card 101 may be needed when the NFC chip 201 operates for an electronic payment through a near field communication with an external reader.

The NFC chip 201 performs an SWP communication through the SIM card 101 and a single-wire input/output SWIO to authenticate a subscriber that requests the electronic payment. In the SWP communication, logical states of data bits in a communication packet to be sent are inverted when the number of data bits having a logical high state from among the data bits in the communication packet exceeds half the data width (e.g., the total number of data bits in the communication packet). In this case, a polarity bit in the communication packet is set by a particular logical state (e.g., a logical high state). The inverted data bits and the set polarity bit may constitute a communication packet that is to be transmitted via the single-wire input/output SWIO. Thus, power consumption of the portable electronic device 500 may be reduced because the number of data is to be transferred is reduced by inverting the logical states of the data bits.

The communication packet may be transmitted using the S1 transfer in which data is transmitted from the SIM card 101 to the NFC chip 201. In addition, the communication packet may be transmitted using the S2 transfer in which data is transmitted from the NFC chip 201 to the SIM card 101. Thus, a simultaneous bidirectional data transfer may be implemented because the S1 transfer is different from the S2 transfer.

At a reception side (e.g., a slave side or the NFC chip 201) in the S1 transfer, the NFC chip 201 determines a polarity bit of a received communication packet to recognize whether data of the communication packet is inverted at a transmission side (e.g., the SIM card 101). When the determination result indicates that the data is inverted at the transmission side, logical states of the data bits in the received communication packet are inverted to restore original data.

At a reception side (e.g., a master side or the SIM card 101) in the S2 transfer, the SIM card 101 determines a polarity bit of a received communication packet to recognize whether data of the communication packet is inverted at a transmission side (e.g., the NFC chip 201). When the determination result indicates that the data is inverted at the transmission side, logical states of the data bits in the received communication packet are inverted to restore original data.

The portable electronic device 500 according to an exemplary embodiment of the present inventive concept inverts and transmits data when the number of data bits having a specific logical state exceeds half the number of data bits in a communication packet, and sets a polarity bit to either of a logical high or low state. Thus, power consumption of the portable electronic device 500 when performing the SWP communication may be reduced, and thus a battery life of the device 500 may be saved.

Figure 13:
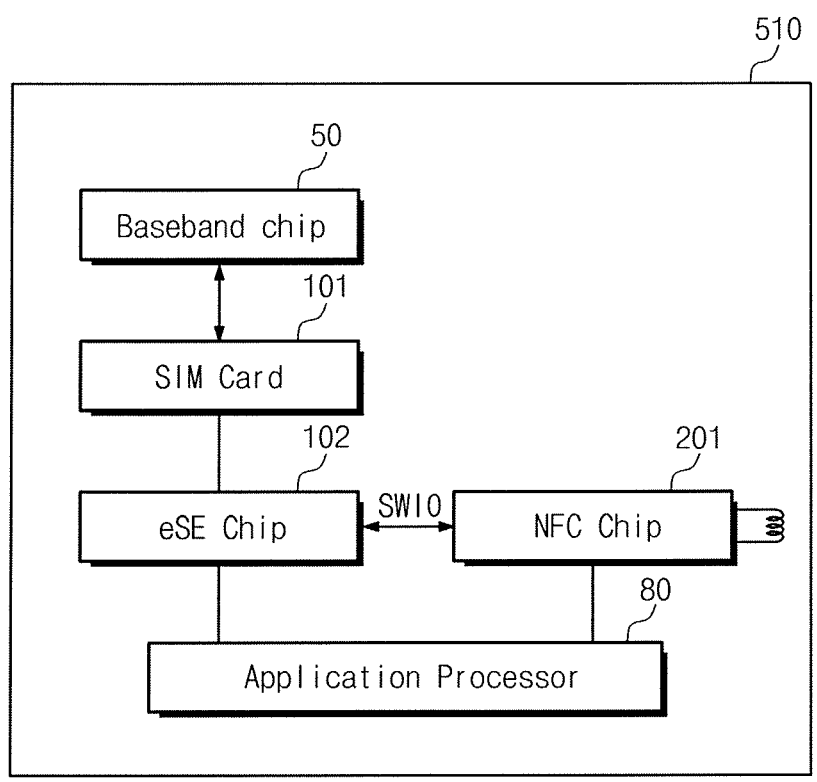
FIG. 13 is a block diagram of a portable electronic device according to an exemplary embodiment of the present inventive concept.

FIG. 13 is a block diagram of a portable electronic device according to an exemplary embodiment of the present inventive concept.

Referring to FIG. 13, a portable electronic device 510 includes a baseband chip 50, a SIM card 101, an embedded Secure Element (eSE) chip 102, an NFC chip 201, and an application processor 80.

The eSE chip 102 stores a secure authentication code for authenticating a security associated with the mobile.

The application processor 80 provides communication functions, multimedia functions added to a smart phone, various convenient functions, and so on.

The security authentication code stored in the eSE chip 102 may be employed when the NFC chip 201 functions as a smart card that performs a near field communication with an external reader.

The NFC chip 201 performs the SWP communication via the eSE chip 102 and a single-wire input/output SWIO for security authentication on a finance card function.

The portable electronic device 510 may employ a data communication method that complies with the SWP communication using a single-wire input/output SWIO.

In the SWP communication, logical states of data bits in a communication packet to be sent are inverted when the number of data bits having a logical high state from among the data bits in the communication packet exceeds half the number of data bits in the communication packet. In this case, a polarity bit in the communication packet is set by a particular logical state (e.g., a logical high state). The inverted data bits and the set polarity bit may constitute a communication packet that is to be transmitted via the single-wire input/output SWIO. Thus, power consumption of the portable electronic device 510 may be reduced because the number of data 1s to be transferred is reduced by inverting the logical states of the data bits.

The communication packet may be transmitted using the S1 transfer in which data is transmitted from the eSE chip 102 to the NFC chip 201. In addition, the communication packet may be transmitted using the S2 transfer in which data is transmitted from the NFC chip 201 to the eSE chip 102. Thus, a simultaneous bidirectional data transfer may be implemented because the S1 transfer is different from the S2 transfer.

At a reception side (e.g., a slave side or the NFC chip 201) in the S1 transfer, the NFC chip 201 determines a polarity bit of a received communication packet to recognize whether data of the communication packet is inverted at a transmission side (e.g., the eSE chip 102). When the determination result indicates that the data is inverted at the transmission side, logical states of the data bits in the received communication packet are inverted to restore original data.

At a reception side (e.g., a master side or the eSE chip 102) in the S2 transfer, the eSE chip 102 determines a polarity bit of a received communication packet to recognize whether data of the communication packet is inverted at a transmission side (e.g., the NFC chip 201). When the determination results indicates that the data is inverted at the transmission side, logical states of the data bits in the received communication packet are inverted to restore original data.

The control procedure shown in FIG. 6 may be used in the portable electronic device 510. For example, the portable electronic device 510 according to an exemplary embodiment of the present inventive concept inverts and transmits data when the number of data bits having a specific logical state exceeds half the number of data bits in a communication packet, and sets a polarity bit to either of a logical high or low state. Thus, power consumption of the portable electronic device 510 when performing the SWP communication may be reduced, and thus a battery life of the device 510 may be saved.

Figure 14:
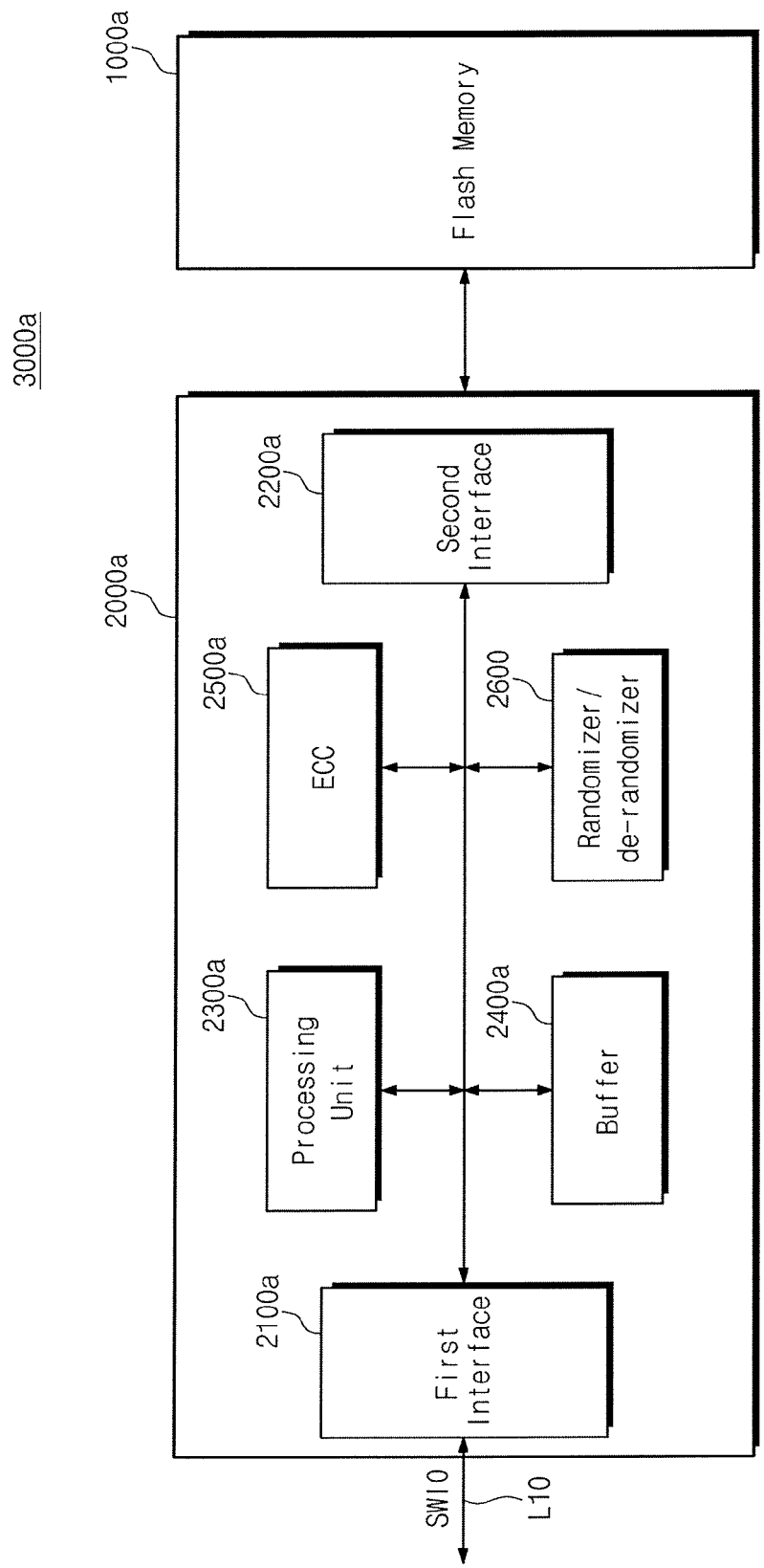
FIG. 14 is a block diagram of a memory system according to an exemplary embodiment of the present inventive concept.

FIG. 14 is a block diagram of a memory system, according to an exemplary embodiment of the present inventive concept.

Referring to FIG. 14, a memory system 3000a includes at least one flash memory device 1000a and a controller 2000a.

The flash memory device 1000a operates under the control of the controller 2000a. The flash memory device 1000a is used as a storage medium. The controller 2000a is configured to control the flash memory device 1000a. The controller 2000a is configured to randomize data which is to be stored in the flash memory device 1000a, and to add Error Correction Code (ECC) data to the randomized data. The controller 2000a is configured to perform detecting and correcting operations on errors in the randomized data which is read out from the flash memory device 1000a, and to de-randomize the randomized data.

The controller 2000a includes a first interface 2100a, a second interface 2200a, a processing unit 2300a, a buffer memory 2400a, an ECC block 2500a, and a randomizer/de-randomizer block 2600.

The first interface 2100a includes a variety of protocols for exchanging data between a host and the controller 2000a. The controller 2000a may communicate with a host or an external device through at least one of various interface protocols such as a Universal Serial Bus (USB) protocol, a Multimedia Card (MMC) protocol, a Peripheral Component Interconnection (PCI) protocol, a PCI-Express (PCI-E) protocol, an Advanced Technology Attachment (ATA) protocol, a serial-ATA protocol, a parallel-ATA protocol, an Small Computer Small Interface (SCSI) protocol, an Enhanced Small Disk Interface (ESDI) protocol, an Integrated Drive Electronics (IDE) protocol, or the like.

In addition, the first interface 2100a includes the SWP that supports data exchange between an external device (e.g., an external chip) and the controller 2000a. An SWP communication may be performed in both directions via a single-wire input/output (SWIO) L10. Power consumption in the SWP communication may be reduced when data is selectively inverted during the S1 or S2 transfer.

The ECC block 2500a generates ECC data based on the randomized data output from the randomizer/de-randomizer block 2600. Further, the ECC block 2500a performs an error detecting and correcting operation on data (e.g., the randomized data) which is read out from the flash memory device 1000a based on the ECC data. The ECC data may be stored in the same region as data which is to be stored in the flash memory device 1000a. In an exemplary embodiment of the present inventive concept, the ECC data may be stored in a different region from the data which is to be stored in the flash memory device 1000a.

In case of the memory system shown in FIG. 14, a write operation may include randomizing data which is to be stored in the flash memory device 1000a; generating ECC data based on the randomized data; and storing the ECC data and the randomized data in the flash memory device 1000a. In an exemplary embodiment of the present inventive concept, the write operation may include randomizing both the data which is to be stored and the ECC data and storing the randomized result in the flash memory device 1000a. A read operation may include performing error detecting and correcting operations on data (e.g., the randomized data) which is read out from the flash memory device 1000a based on the ECC data; and de-randomizing the read data.

Figure 15:
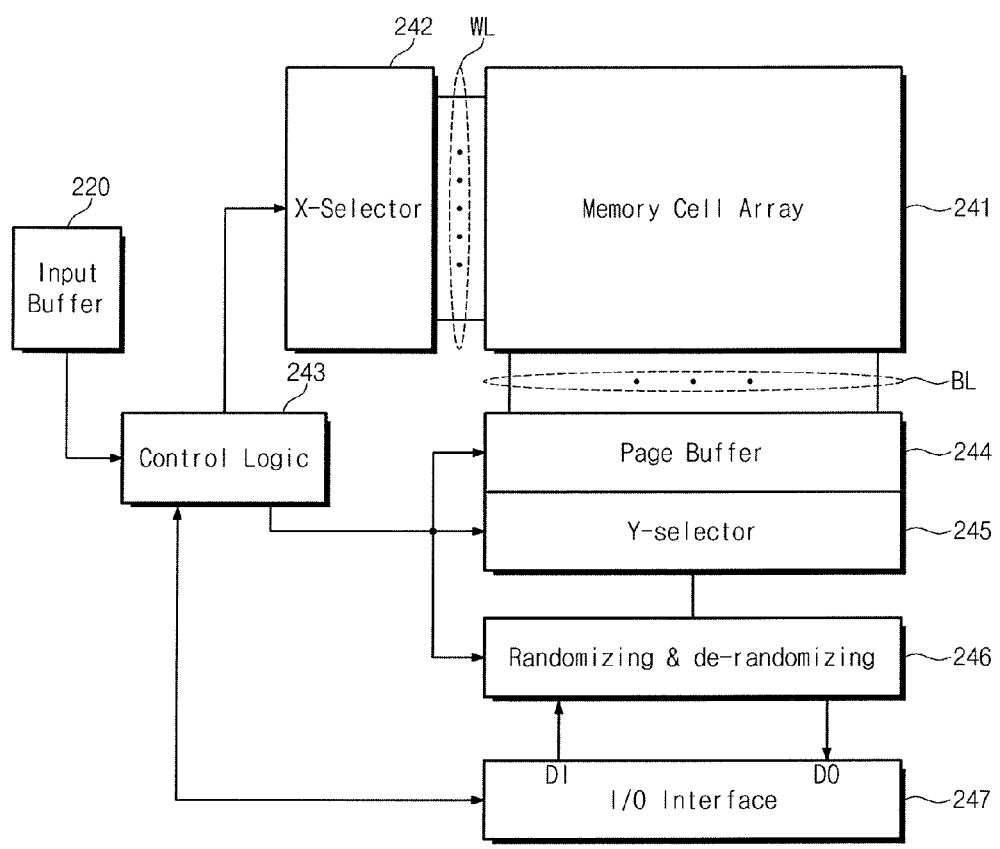
FIG. 15 is a block diagram of a flash memory device shown in FIG. 14 according to an exemplary embodiment of the present inventive concept.

FIG. 15 is a block diagram of a flash memory device shown in FIG. 14 according to an exemplary embodiment of the present inventive concept.

Referring to FIG. 15, a flash memory device may be a NAND flash memory device. However, the present inventive concept is not limited thereto. For example, according to an exemplary embodiment of the present inventive concept, the flash memory device may be an Electrically Erasable Programmable Read-Only Memory (EEPROM), an Magnetic RAM (MRAM), a Spin-Transfer Torque MRAM (STT MRAM), a Conductive bridging RAM (CBRAM), a FeRAM (Ferroelectric RAM), a PRAM (Phase change RAM, also called as an Ovonic Unified Memory (OUM)), a Resistive RAM (RRAM or ReRAM), a Nanotube RRAM, a Polymer RAM (PoRAM), a Nano Floating Gate Memory (NFGM), a holographic memory, a Molecular Electronics Memory Device, an Insulator Resistance Change Memory, or the like.

The flash memory device includes a memory cell array 241, which has memory cells arranged in rows (e.g., word lines WL) and columns (e.g., bit lines BL). Each memory cell may store 1-bit data or M-bit (multi-bit) data (M being an integer of two or more). When each memory cell stores 1-bit data, memory cells in each row of the memory cell array 214 may constitute a memory space. When each memory cell stores M-bit data, memory cells in each row of the memory cell array 214 may constitute memory spaces corresponding to multiple pages, respectively. Each memory cell may have a charge storing layer, such as a floating gate or a charge trap layer. Each memory cell may have a variable resistance element. The memory cell array 241 may have a single-layer array structure (referred to as a two-dimensional array structure), or a multi-layer array structure (referred to as a vertical-type or stack-type three-dimensional array structure).

A row selector circuit 242 is controlled by a control logic 243 connected to an input buffer 220, and the row selector circuit 242 is configured to perform selecting and driving operations on rows of the memory cell array 241.

The control logic 243 may be configured to control overall operations of the flash memory device.

A page buffer circuit 244 is controlled by the control logic 243, and the page buffer circuit 244 is configured to operate as a sense amplifier or a write driver according to an operation mode. For example, during a read operation, the page buffer circuit 244 may operate as the sense amplifier which senses data from a selected row of the memory cells. During a program operation, the page buffer circuit 244 may operate as the write driver which drives a selected row of the memory cells according to program data. The page buffer circuit 244 may include page buffers corresponding to bit lines or bit line pairs, respectively. When each memory cell stores multi-bit data, each page buffer of the page buffer circuit 244 may be configured to have two or more latches.

Continuing to refer to FIG. 15, a column selector circuit 245 is controlled by the control logic 243, and the column selector circuit 245 is configured to sequentially select columns (or page buffers) by a predetermined unit during read/program operations. A randomizing and de-randomizing circuit 246 randomizes data (e.g., original data or data which is to be programmed), which is transferred via an input/output interface 247, under the control of the control logic 243. In addition, the randomizing and de-randomizing circuit 246 de-randomizes data (e.g., randomized data) of the page buffer circuit 244 transferred via the column selector circuit 245, under the control of the control logic 300.

The randomizing and de-randomizing circuit 246 may be configured to perform randomizing and de-randomizing operations on full-page data and random data smaller than the full-page data. For example, the random data may be data in a spare region, sector data, data greater than the sector data and smaller than page data, or data smaller than the sector data.

A memory cell may have any one of $2^N$ threshold voltage distributions (N indicating the number of data bits stored in the memory cell) according to the amount of charges stored in its charge storing means. For example, a threshold voltage (or, a threshold voltage distribution) of a memory cell may be changed due to coupling (e.g., word line coupling) caused between adjacent memory cells.

The randomizing of data may reduce variations in threshold voltages of memory cells due to the word line coupling. For example, since states of memory cells are distributed uniformly by the data randomization, a degree of the word line coupling among memory cells may be relatively less than that of a case in which the data randomization is not performed. For example, variations in threshold voltages of memory cells may be suppressed. Accordingly, a read margin for the data may be increased, and thus reliability of the flash memory device may be increased. The randomizing and de-randomizing operations may be performed selectively. For example, the randomizing and de-randomizing circuit 246 may not perform randomizing and de-randomizing operations when an access to specific data or a specific region is requested.

When each memory cell of the flash memory device stores M-bit data, a voltage with a predetermined level is supplied to a word line of a memory cell selected for a read operation. For example, a read method according to an exemplary embodiment of the present inventive concept may include sequentially carrying out operations of starting a word line voltage by supplying a voltage higher than the predetermined level to the word line, providing the word line with the voltage having the predetermined level, and setting a word line voltage with the predetermined level to perform a read operation.

For example, in case the flash memory device includes multi-level cells, low-level, intermediate-level, and high-level voltages may be selectively supplied to a word line in a read operation.

The flash memory device shown in FIG. 15 may be used in the memory system 3000a shown in FIG. 14. In addition, the flash memory device shown in FIG. 15 may be used as a storage device in the SIM card 101 shown in FIG. 12 or a storage device in the eSE chip 102.

Figure 16:
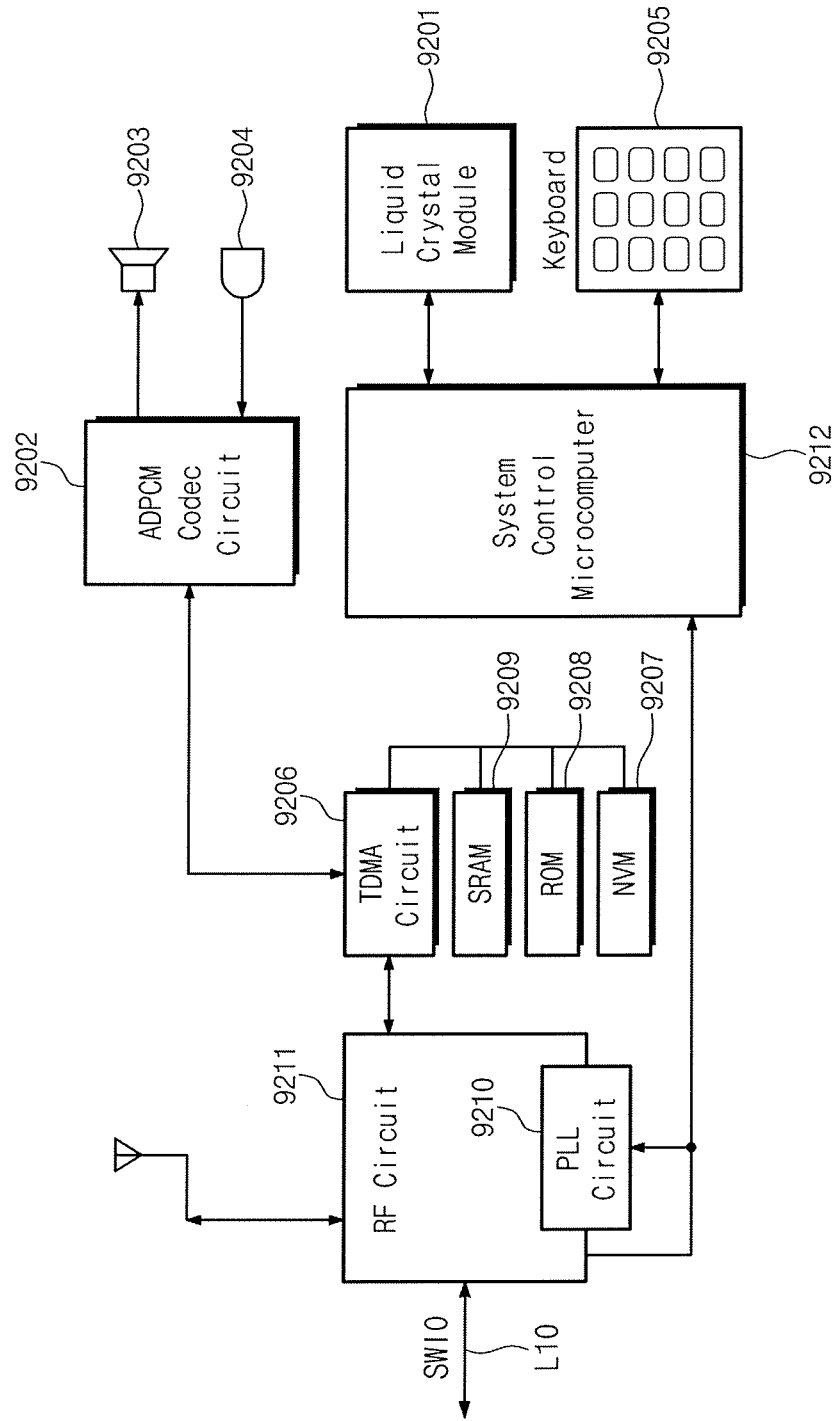
FIG. 16 is a block diagram of a cellular phone system including a flash memory device, according to an exemplary embodiment of the present inventive concept.

FIG. 16 is a block diagram of a cellular phone system including a flash memory device, according to an exemplary embodiment of the present inventive concept.

Referring to FIG. 16, a cellular phone system includes an Adaptive Differential Pulse-Code Modulation (ADPCM) codec circuit 9202 for compressing a voice and decompressing a compressed voice, a speaker 9203, a microphone 9204, a Time-Division Multiple Access (TDMA) circuit 9206 for time-division multiplexing digital data, a PLL circuit 9210 configured to set a carrier frequency of an RF signal, and an RF circuit 9211 configured to send and receive a radio frequency signal.

Further, the cellular phone system may include various types of memories, such as a flash memory device 9207 as a nonvolatile memory device, a Read Only Memory (ROM) 9208, and a Static RAM (SRAM) 9209. As the memory device 9207 of the cellular phone system, the flash memory device shown in FIG. 15 may be used. The ROM 9208 may be used to store programs, and the SRAM 9209 may be used as a working region for a system control microcomputer 9212 or as a memory for temporarily storing data. The system control microcomputer 9212 may be a processor that is configured to control write and read operations of the flash memory device 9207.

Power consumption of the cellular phone system of FIG. 16 in which the SWP communication according to an exemplary embodiment of the present inventive concept is performed may be reduced, and a battery life of the system may be saved.

The present inventive concept is not limited to the cellular phone system of FIG. 16. For example, the cellular phone system may be modified or changed to a computer, a ultra-mobile personal computer (UMPC), a workstation, a net-book, a personal digital assistant (PDA), a portable computer (PC), a web tablet, a wireless phone, a three-dimensional television, an e-book, a portable multimedia player (PMP), a portable game console, a navigation device, a black box, a digital camera, a digital multimedia broadcasting (DMB) player, a digital audio recorder, a digital audio player, a digital picture recorder, a digital picture player, a digital video recorder, a digital video player, a device for transmitting and receiving information via a wireless channel, one of a variety of electronic devices constituting a home network, one of a variety of electronic devices constituting a computer network, one of a variety of electronic devices constituting a telematics network, a radio frequency identification (RFID) device, one of various components constituting a computing system, or the like.

Figure 17:
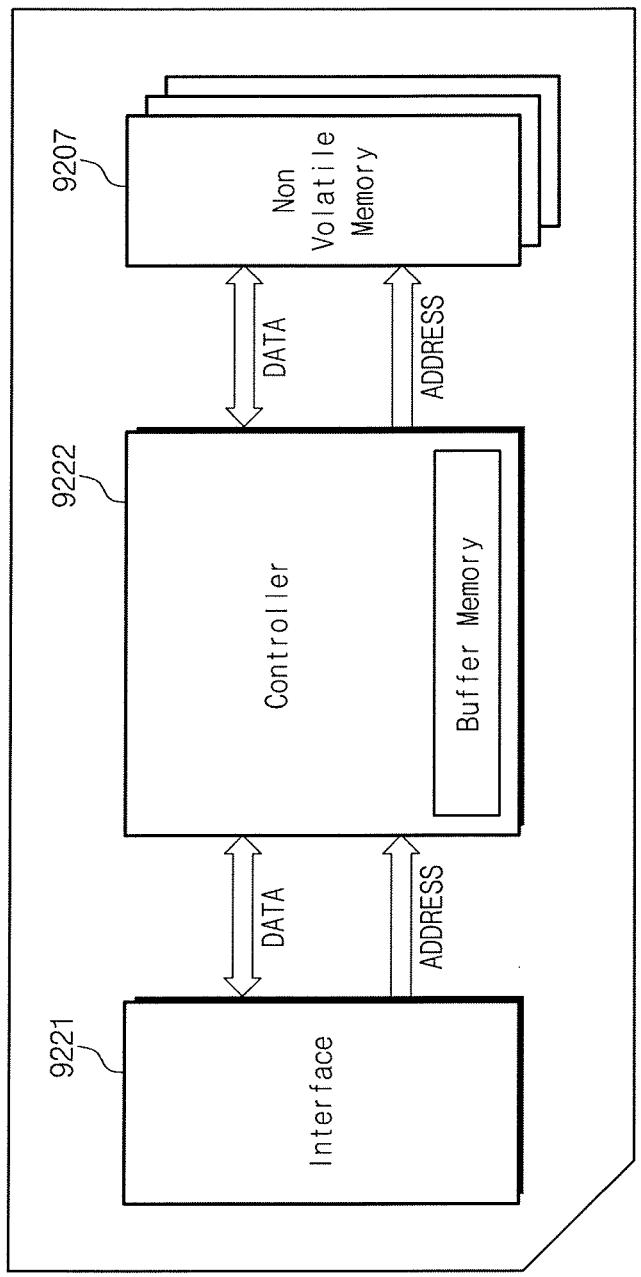
FIG. 17 is a block diagram of a memory card including a flash memory device shown in FIG. 15, according to an exemplary embodiment of the present inventive concept.

FIG. 17 is a block diagram of a memory card including a flash memory device shown in FIG. 15, according to an exemplary embodiment of the present inventive concept.

A memory card, for example, may be an MMC card, an SD card, a multiuse card, a micro-SD card, a memory stick, a compact SD card, an ID card, a Personal Computer Memory Card International Association (PCMCIA) card, an SSD card, a chip-card, a smartcard, a USB card, an MCP-type embedded card storage, and so on. The MCP-type embedded card storage may include an embedded MMC (eMMC), an embedded SD (eSD), an embedded SSD (eSSD), a Perfect Page NAND (PPN), and so on.

Referring to FIG. 17, the memory card may include an interface circuit 9221 for interfacing with an external device, a controller 9222, including a buffer memory, for controlling an operation of the memory card, and at least one flash memory device 9207. The controller 9222 may be a processor which is configured to control write and read operations of the flash memory device 9207. For example, the controller 9222 may be coupled with the nonvolatile memory device 9207 and the interface circuit 9221 via a data bus DATA and an address bus ADDRESS.

Power consumption of the memory card of FIG. 17 in which the SWP communication according to an exemplary embodiment of the present inventive concept is performed may be reduced.

Figure 18:
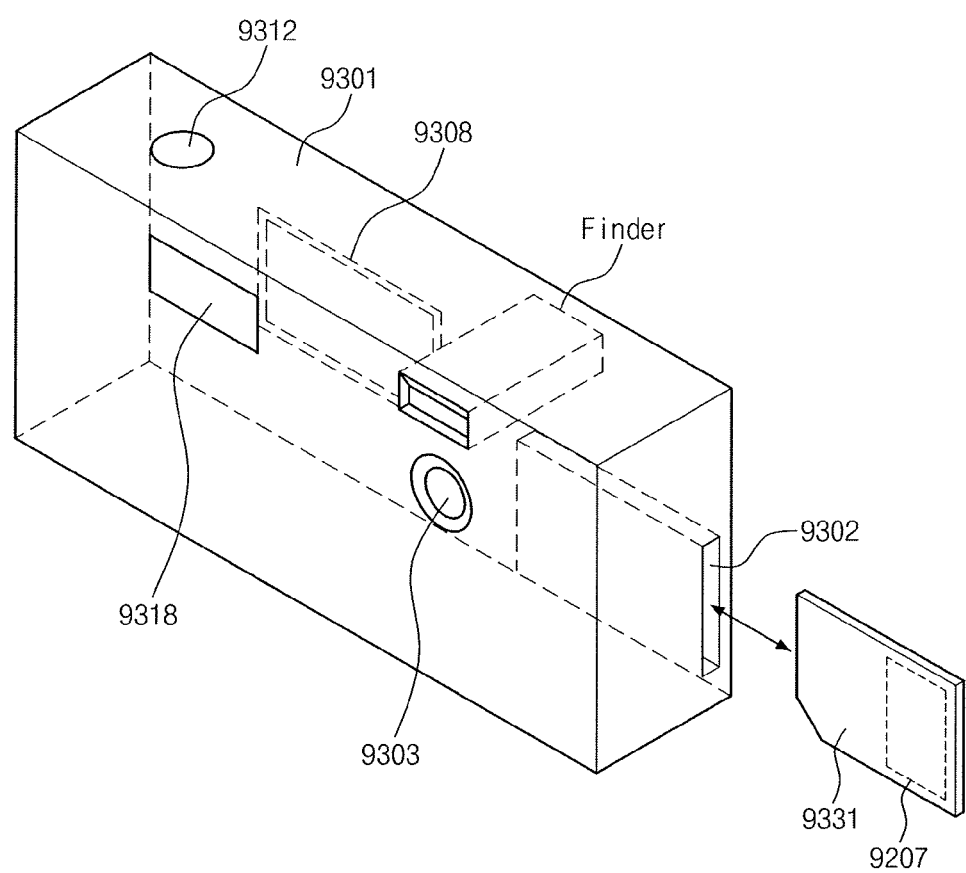
FIG. 18 is a block diagram of a digital still camera using a memory card according to an exemplary embodiment of the present inventive concept.

FIG. 18 is a block diagram of a digital still camera using a memory card, according to an exemplary embodiment of the present inventive concept.

Referring to FIG. 18, a digital still camera includes a body 9301, a slot 9302, a lens 9303, a display circuit 9308, a shutter button 9312, a strobe 9318, and so on. For example, a memory card 9331 may be inserted in the slot 9302, and the memory card 9331 may include at least one flash memory device 9207 as shown in FIG. 17. If the memory card 9331 is of a contact type, an electric circuit on a circuit board may electrically contact the memory card 9331 when inserted in the slot 2302 to communicate therewith. If the memory card 9331 is of a non-contact type, an electric circuit on a circuit board may not contact the memory card 9331 and may communicate with the memory card 9331 via a radio-frequency signal.

Power consumption of the digital still camera of FIG. 18 in which the SWP communication according to an exemplary embodiment of the present inventive concept is performed may be reduced.

Figure 19:
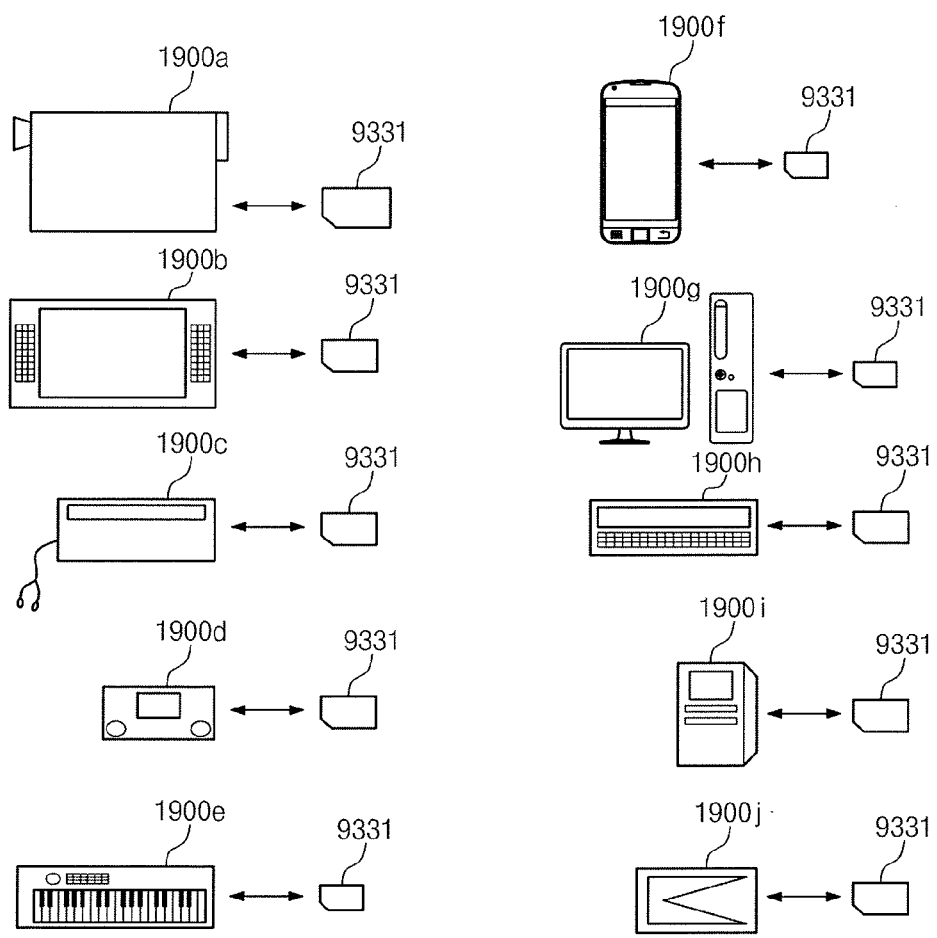
FIG. 19 is a diagram of various systems in which the memory card in FIG. 17 is used according to an exemplary embodiment of the present inventive concept.

FIG. 19 is a diagram of various systems in which the memory card of FIG. 17 is used according to an exemplary embodiment of the present inventive concept.

Referring to FIG. 19, a memory card 9331 may be applied to a video camera 1900*a*, a television 1900*b*, an audio device 1900*c*, a game machine 1900*d*, an electronic music device 1900*e*, a cellular phone 1900*f*, a computer 1900*g*, a PDA 1900*h*, a voice recorder 1900*i*, a PC card 1900*j*, and so on.

The memory card 9331 according to an exemplary embodiment of the present inventive concept may be used in the systems shown in FIG. 19, and power consumption of the systems shown in FIG. 19 may be reduced.

Figure 20:
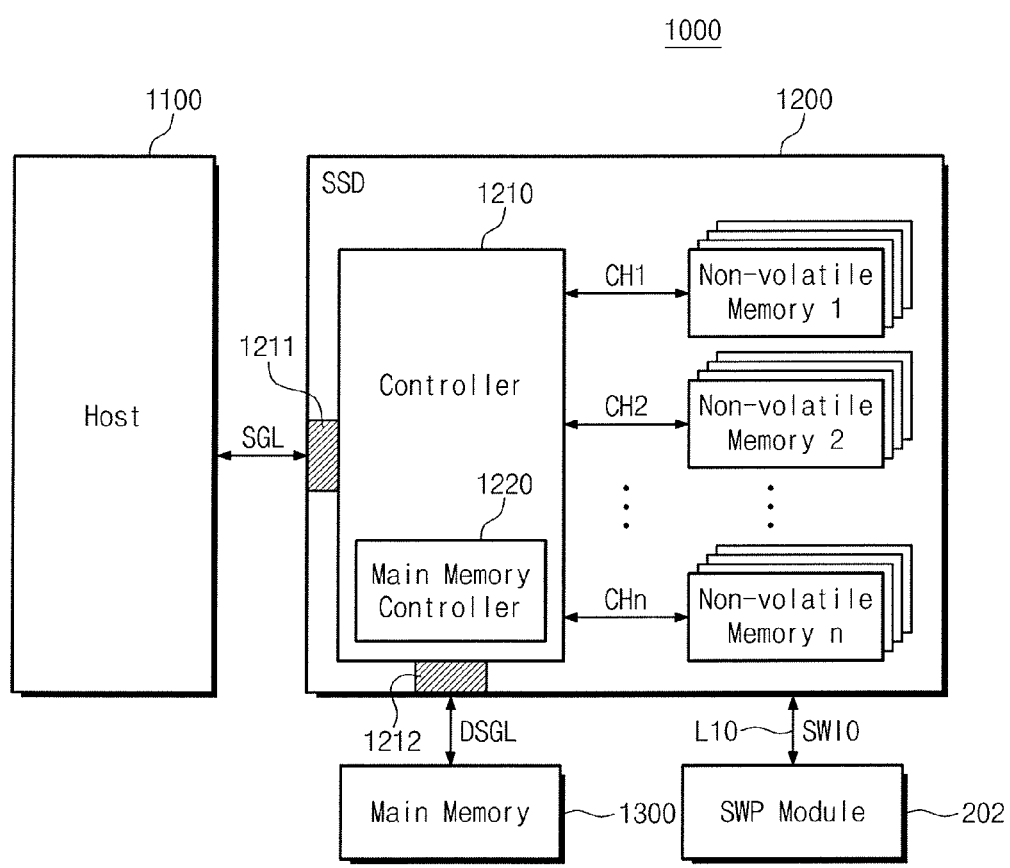
FIG. 20 is a block diagram of a solid state drive according to an exemplary embodiment of the present inventive concept.

FIG. 20 is a block diagram of an SSD according to an exemplary embodiment of the present inventive concept.

Referring to FIG. 20, an SSD system 1000 comprises a host 1100 and an SSD 1200. The SSD 1200 exchanges signals SGL with the host 1100 through a host signal connector 1211, and the SSD 1200 exchanges signals with a main memory 1300 via a memory signal connector 1212. The SSD 1200 comprises a plurality of nonvolatile memory devices, an SSD controller 1210, an SWP module 202, and a main memory controller 1220.

For example, the main memory controller 1220 may be included in the SSD controller 1210. The nonvolatile memory devices may be used as storage medium of the SSD 1200. The nonvolatile memory devices may be implemented with a flash memory device having a mass storage capacity. However, the present inventive concept is not limited thereto. For example, the SSD 1200 may use a flash memory device as the nonvolatile memory devices, but the SSD 1200 may use nonvolatile memory devices, such as PRAM, MRAM, ReRAM, FRAM, and so on.

The nonvolatile memory devices are connected to the SSD controller 1210 through a plurality of channels CH1 to CHn. One channel may be connected to one or more memory devices (e.g., nonvolatile memory devices). Memory devices connected to one channel may be connected to the same data bus.

The SSD controller 1210 exchanges signals SGL with the host 1100 through the host signal connector 1211. The main memory controller 1220 exchanges signals DSGL with the main memory 1300 via the memory signal connector 1212. The signals SGL may include a command, an address, data, and so on.

The main memory 1300 may be implemented using a DRAM. However, the present inventive concept is not limited thereto. For example, the main memory 1300 may be implemented using a nonvolatile memory device such as an MRAM), or the like. The MRAM retains data stored therein even at power-off. In case data must be retained even at power-off, a nonvolatile memory device may be used to store data. For example, the main memory 1300 may be implemented using an STT-MRAM which may have advantages of both the DRAM and the MRAM.

An STT-MRAM cell (e.g., a memory cell implemented using an STT MRAM) may include an Magnetic Tunnel Junction (MTJ) element and a selection transistor. The MTJ element may include a fixed layer, a free layer, and a tunnel layer interposed between the fixed layer and the free layer. A magnetization direction of the fixed layer may be fixed, and a magnetization direction of the free layer may be equal to or opposite to that of the fixed layer according to a condition.

Each or all of a chip of the main memory 1300 and a chip of the host 1100 may be packaged according to various packaging technologies or shapes. According to an exemplary embodiment of the present inventive concept, such packaging technologies may include Package on Package (POP), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Small Outline Integrate Circuit (SOIC), Shrink Small Outline Package (SSOP), Thin Small Outline Package (TSOP), Thin Quad Flatpack (TQFP), System In Package (SIP), Multi Chip Package (MCP), Wafer-level Fabricated Package (WFP), Wafer-Level Processed Stack Package (WSP), or the like.

Power consumption of the SSD 1200 in which the SWP communication according to an exemplary embodiment of the present inventive concept is performed may be reduced. The present inventive concept is not limited to the SSD of FIG. 20. For example, the present inventive concept may be applicable to an embedded MMC (eMMC).

While the present inventive concept has been described with reference to exemplary embodiments thereof, it will be understood by those skilled in the art that the present inventive concept is not limited to the disclosed exemplary embodiments and various changes and modifications in form and details may be made thereto without departing from the spirit and scope of the present inventive concept as defined by the following claims.

What is claimed is:

1. A data communication method in a single-wire protocol communication, the data communication method comprising:

determining a number of first data bits having a logical high state or a number of second data bits having a logical low state from among data bits in a communication packet, determining whether the number of the first data bits is greater than a first predetermined number or the number of the second data bits is smaller than a second predetermined number;

inverting the data bits in the communication packet when the number of the first data bits is greater than the first predetermined number or the number of the second data bits is smaller than the second predetermined number; and transferring the inverted data bits to a reception side via a single-wire input/output, wherein the data bits of the communication packet are transferred in a first direction of the single-wire input/output in a first technique, and wherein the data bits of the communication packet are transferred in a second direction of the single-wire input/output in a second technique, the second direction being opposite to the first direction.

2. The data communication method of claim 1, further comprising setting a polarity bit indicating that the data bits of the communication packet are inverted.

3. The data communication method of claim 1, wherein the data bits in the communication packet are transferred via the single-wire input/output without inversion of the data bits when the number of the first data bits is smaller than the first predetermined number or the number of the second data bits is greater than the second predetermined number.

4. The data communication method of claim 1, wherein the first technique is a current sink modulation technique and the second technique is a pulse width modulation technique.

5. The data communication method of claim 1, wherein the single-wire input/output is connected between a near field communication (NFC) chip and a subscriber identification module (SIM) card chip.

6. The data communication method of claim 1, wherein the single-wire input/output is connected between a near field communication (NFC) chip and an embedded secure element (eSE) chip.

7. The data communication method of claim 2, wherein the polarity bit is set to be a logical high state.

8. The data communication method of claim 1, wherein the inverted data bits are inverted at the reception side.

9. The data communication method of claim 1, wherein the data communication method is used in a portable electronic device including a near field communication (NFC) chip.

10. A single-wire protocol communication system comprising:
a first circuit;
a second circuit; and
a single-wire input/output connected between the first circuit and the second circuit,
wherein at least one of the first and second circuits is configured to invert logical states of data bits in a communication packet when a number of first data bits having a first logical state from among the data bits of the communication packet exceeds a predetermined number, to set a polarity bit indicating that the data bits are inverted, and to transmit the set polarity bit and the inverted data bits via the single-wire input/output,
wherein the data bits of the communication packet are transferred in a first direction of the single-wire input/output using a pulse width modulation technique,
wherein the data bits of the communication packet are transferred in a second direction of the single-wire input/output using a current sink modulation technique.

11. The single-wire protocol communication system of claim 10, wherein the predetermined number is half a number of the data bits in the communication packet.

12. The single-wire protocol communication system of claim 10, wherein the data bits in the communication packet are transferred via the single-wire input/output without inversion of the logical states of the data bits when the number of the first data bits is less than the predetermined number.

13. The single-wire protocol communication system of claim 10, wherein the single-wire input/output is connected between a near field communication (NFC) chip and a subscriber identification module (SIM) card chip, or between the NFC chip and an embedded secure element (eSE) chip.

14. A single-wire protocol communication system comprising:
a first circuit configured to transmit a first communication packet to a second circuit and to receive a second communication packet from the second circuit;
the second circuit configured to transmit the second communication packet to the first circuit and to receive the first communication packet from the first circuit; and
a single-wire input/output through which the first and second circuits transmit and receive the first and second communication packets,
wherein data bits of the first communication packet are inverted when a number of first data bits having a logical high state among the data bits of the first communication packet exceeds a predetermined number,
wherein the data bits of the first communication packet are not inverted when the number of the first data bits having the logical high state among the data bits of the first communication packet is less than the predetermined number,
wherein the data bits of the first communication packet are transferred in a first direction using a first technique, and data bits of the second communication packet are transferred in a second direction using a second technique.

15. The single-wire protocol communication system of claim 14, wherein the first circuit is a master circuit, and the second circuit is a slave circuit.

16. The single-wire protocol communication system of claim 14, wherein the first technique is a pulse width modulation technique or a current sink modulation technique.

17. The single-wire protocol communication system of claim 15, wherein the data bits of the second communication packet are inverted when a number of second data bits having the logical high state among the data bits of the second communication packet exceeds a predetermined number,
wherein the data bits of the second communication packet are not inverted when the number of the second data bits having the logical high state among the data bits of the second communication packet is less than the predetermined number, and
wherein the first technique is a pulse width modulation technique, and the second technique is a current sink modulation technique.

18. The single-wire protocol communication system of claim 15, wherein the data bits of the second communication packet are inverted when a number of second data bits having the logical high state among the data bits of the second communication packet exceeds a predetermined number,
wherein the data bits of the second communication packet are not inverted when the number of the second data bits having the logical high state among the data bits of the second communication packet is less than the predetermined number, and
wherein the first technique is a current sink modulation technique, and the second technique is a pulse width modulation technique.

* * * * *